United States Patent [19]

Rosener

[11] Patent Number: 5,164,673
[45] Date of Patent: Nov. 17, 1992

[54] INDUCED ELECTRIC FIELD SENSOR

[76] Inventor: Kirk W. Rosener, 220 Alcalde Moreno, Hollywood Park, Tex. 78232

[21] Appl. No.: 435,253

[22] Filed: Nov. 13, 1989

[51] Int. Cl.[5] .............................................. G01R 29/12
[52] U.S. Cl. ..................................... 324/457; 324/452
[58] Field of Search ................ 324/452, 455, 457, 458

[56] References Cited

U.S. PATENT DOCUMENTS

| | | | |
|---|---|---|---|
| 2,333,975 | 11/1943 | Bennett | 324/457 X |
| 3,254,297 | 5/1966 | McAlister et al. | 324/361 |
| 3,464,000 | 8/1969 | Ower | 324/352 |
| 3,727,125 | 4/1973 | Maurter | 324/455 |
| 3,729,675 | 4/1973 | Vosteen | 324/457 X |
| 4,106,869 | 8/1978 | Buchheit | 324/455 |
| 4,326,796 | 4/1982 | Champion et al. | 324/457 |
| 4,359,687 | 11/1982 | Vinegar et al. | 324/362 |
| 4,393,719 | 7/1983 | Wiegand et al. | 73/861.09 |
| 4,467,283 | 8/1984 | Owen et al. | 324/363 |
| 4,506,226 | 3/1985 | Luce et al. | 324/459 |
| 4,520,318 | 5/1985 | Hascal et al. | 324/457 |
| 4,529,940 | 7/1985 | Blitshteyn | 324/458 |
| 4,625,176 | 11/1986 | Champion et al. | 324/457 X |
| 4,626,785 | 12/1986 | Hagiwara | 324/339 |
| 4,629,992 | 12/1986 | Nudermont | 324/464 |
| 4,642,559 | 2/1987 | Slough | 324/457 |
| 4,646,025 | 2/1987 | Martin et al. | 324/340 |
| 4,652,829 | 3/1987 | Satinya | 324/341 |
| 4,663,593 | 5/1987 | Nekut, Jr. | 324/348 |
| 4,677,386 | 6/1987 | Chapman et al. | 324/347 |
| 4,878,017 | 10/1989 | Williams | 324/458 |

FOREIGN PATENT DOCUMENTS

0180151 8/1986 Japan .................................. 324/457

OTHER PUBLICATIONS

Vosteen, A review of current Electrostatic Measurement Techniques and their Limitations, Apr. 1984.

Primary Examiner—Jack B. Harvey

[57] ABSTRACT

An electrostatic field measurement sensor that determines the position and location of items under study, with respect to the location of the measurement apparatus. This position and location determination of items under study is performed by the sensor actively inducing, and then measuring the corresponding electric field response, both magnitude and direction, of all items under study that are within the field of view of the sensor. The field of view of the sensor is within a three dimensional space surrounding the sensor. The distance vector of the detection range of the sensor is directly correlated with the magnitude of the electric field surrounding the sensor.

12 Claims, 3 Drawing Sheets

INDUCED ELECTRIC FIELD SENSOR

BACKGROUND OF THE INVENTION

1. Field of the Invention

This invention relates to electrostatic field measurement devices and, more specifically to an electrostatic field measurement device that determines the position and location of item(s) under study with respect to the location of the measurement device, by actively inducing, and then measuring the corresponding electrostatic response, both magnitude and direction (vector), of item(s) under study, within the field of view of the measurement device. The field of view of the device is within a three dimensional space surrounding the measurement device. The distance portion of the vector, that represents the sensing capability of the measurement device, is directly correlated to the amount of the electric field developed by the measurement device, and the medium located between the device and the item(s) under study. In addition, the invention seeks an electrostatic field response from item(s) under study that is representative of their overall electrostatic field capacity, and not the electric field representative of just one surface of the item{s} under study.

2. Description of the Related Art

Heretofore, the accuracy of the measurements of the Electric Field (E Field) of items has been restricted by the requirement of the measurement devices to be located very near the item or surface being measured. In addition, it was required to position the sensor using external means. This external positioning was performed in a specific manner, to increase the accuracy of the sensor reading of the local E field. See P. E. Secker and J. N. Chubb, *Journal of Electrostatics*, 16 (1984) 1-19 (Elsevier Science Publishers B. V., Amsterdam; and W. E. Vosteen, *A Review of Current Electrostatic Measurement Techniques and Their Limitations*, Paper presented at the Electrical Overstress Exposition, Apr. 24-26, 1984, San Jose, Calif.

The literature on measuring the Electric field also focuses on using a passive means for the collection of E field data. The IEFS concept is based on using an active means for E field data collection.

Initially it appears that the IEFS should fall into Class 324. However, a review of patents in this class reveals that the concept of actively inducing an external E Field, that forces a corresponding E Field response from Item(s) Under Study (IUS), has not been addressed in the Patent literature to date. All sensor concepts in this class are based on a passive collection of E field data, that corresponds to the peculiar characteristics of the IUS. This results in the established set of sensors, represented in Class 324, detecting the E field data on one surface of the IUS. It can then be inferred that a similar amount of E field information would be detected on the remaining surfaces of the IUS, if the sensor would be presented on the corresponding remaining surfaces.

The IEFS uses a different concept. It presents a known level of E field energy within a range that the E field of the IUS can detect. The IUS subsequently responds to this induced field with its own E field of opposite polarity, in a manner proportional to the energy levels of the induced E field. The IEFS E field (the parameters which are already known), responds to the IUS's E field response by allowing its own E field to move around the IEFS surface. This movement of the E field around the surface of the IEFS, results in a concentration of E field energy density at the location closest to the IUS, and at an energy level that is proportional to the IUS's E field response. Sensing the amount and rate of change of the IEFS E field, at specific locations around the surface of the IEFS, is used to infer specific characteristics that are attributed to the IUS, based on the detected pattern of the E field surrounding the IEFS. These characteristics include location identification of the IUS with respect to the IEFS, as well as determining the change in respective locations over time. These characteristics also provide information that is used to record E field information that is unique to a particular IUS.

The IEFS concept allows E field readings to be made on an IUS, with high levels of accuracy, at much greater distances between the IEFS sensor and the IUS, when compared to the body of sensors addressed in Class 324.

The current body of sensors in Class 324, that uses radiated means to sense E fields, requires a specific external positioning of the sensor, with respect to the surface of the IUS, in order that accurate and repeatable measurements can be made. The IEFS concept does not require specific external positioning with respect to the IUS. It automatically will make accurate and repeatable measurements of both E field magnitude, and location of the IUS, with respect to the location of the IEFS.

A review of additional patents in Class 324, reveals that a sub-class of measuring sensors/meters focuses on detecting an IUS in the ground through conducted means. The IEFS concept is based on using radiated means to detect IUS. The sensitivity of the IEFS in detecting the IUS, is limited only by the electrical properties of the medium that is located between the IEFS and the IUS.

A review of patents in Class 250, reveals that this class of measuring sensors/meters focuses on detecting free ions as they move through space. This passive concept of detecting free ions differs from the IEFS concept, in that the IEFS concept focuses on detecting changes in its own E field in response to opposing charges presented by the IUS. This action/reaction concept focuses on sensing ions that are within the influence of the two E fields of interest.

A review of patents in Class 33, reveals that this class of measuring sensors/meters focuses on detecting the Magnetic field component of an IUS. The IEFS concept senses the Electric field component of the items that Class 33 items would normally detect.

A review of patents in Class 73, reveals that this class of measuring sensors/meters focuses on detecting the rate and/or direction of ion flow in a passive manner. The IEFS concept senses the presence of ions based on the IUS response using an active (action/reaction) concept.

SUMMARY OF INVENTION

This invention provides a device that determines the position and location of Items Under Study (IUS), with respect to the position of the invention. The power source of the invention provides a quantity of electrical ions sufficient to create an electric field on the surface of the invention, which in turn develops an attraction of oppositely charged ions from the surface of IUS within the field of view of the invention. Each of the electric field density measuring sensors of the invention monitor the local field strength of the electric field in the immediate area of their positions. A logic processor, contained within the invention, collects and manipulates the electric field information provided from all of the electric field sensors to develop a vector representation of the strength of the electric field surrounding the invention. Those portions of the invention surface that contain an electric field that is stronger than other portions of the invention surface, represent lobes of electric field density that are being attracted towards a specific IUS.

The invention is constructed in such a manner that the scaler position (x, y, z) of each probe, with respect to the center point of the invention, is known by the logic processor contained within the invention. The invention uses the knowledge of the scaler position of each probe combined with electric field density being reported by each probe at one point in time to identify the three dimensional position of an electric field density lobe with respect to the center of the invention.

As the attraction between the electric fields of the IUS and the invention becomes stronger, the electric field density lobes between them increase in magnitude, based on established principles of physics. When more than one IUS is within the field of view of the invention, multiple lobes of electric field density are created on the surface of the invention to correspond with the positions of each IUS being observed by the invention. The electric field density relationships between these lobes will vary in a manner that is proportional to the amount of electric field attraction being presented by each IUS. The logic processor contained within the invention, applies established principles of physics to manipulate/calculate the electric field density sensor data. This manipulation/calculation of data determines the electric field energy and position vector representation of each IUS, with respect to the position of the invention in a three dimensional space.

The power source of the invention varies the amount of the electric field surrounding the invention so that no, or no substantial, flow of ions occurs between the invention and any IUS within its field of view.

Accordingly, several objects and advantages of the invention include the following. By combining the functions of inducing and monitoring an E field into one instrument, the Induced Electrostatic Field Sensor (IEFS) will:

Detect, and measure the E field response of an IUS at much greater distances than what has previously been achieved by passive electric field sensing concepts.

Detect/determine directional information as to where the IUS, and its associated E field, is located with respect to the location of the IEFS;

Track the change of location of an IUS's E field, with respect to the location of the IEFS, when the IEFS, the IUS, or both, move from their initial locations;

Detect E field information to be used to differentiate one IUS from another.

Detect E Field variations between two or more Induced Electrostatic Field Sensors, by altering or modulating the Electric Field relationship between the sensors. In the context of this discussion, an IEFS that is having its own E Field being influenced by a second IEFS is also considered an IUS.

DETAILED DESCRIPTION OF DRAWINGS

Figure 1:
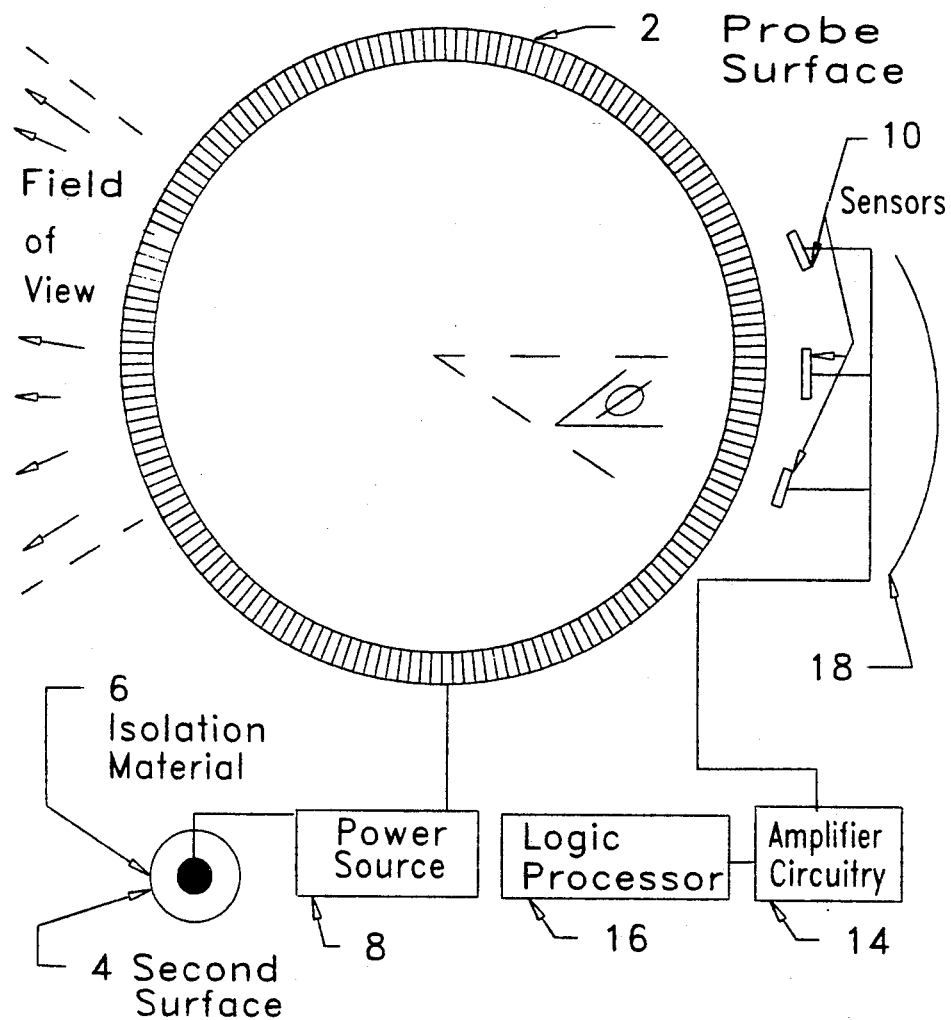
FIG. 1 is an overall view of one embodiment of the invention.
Figure 2:
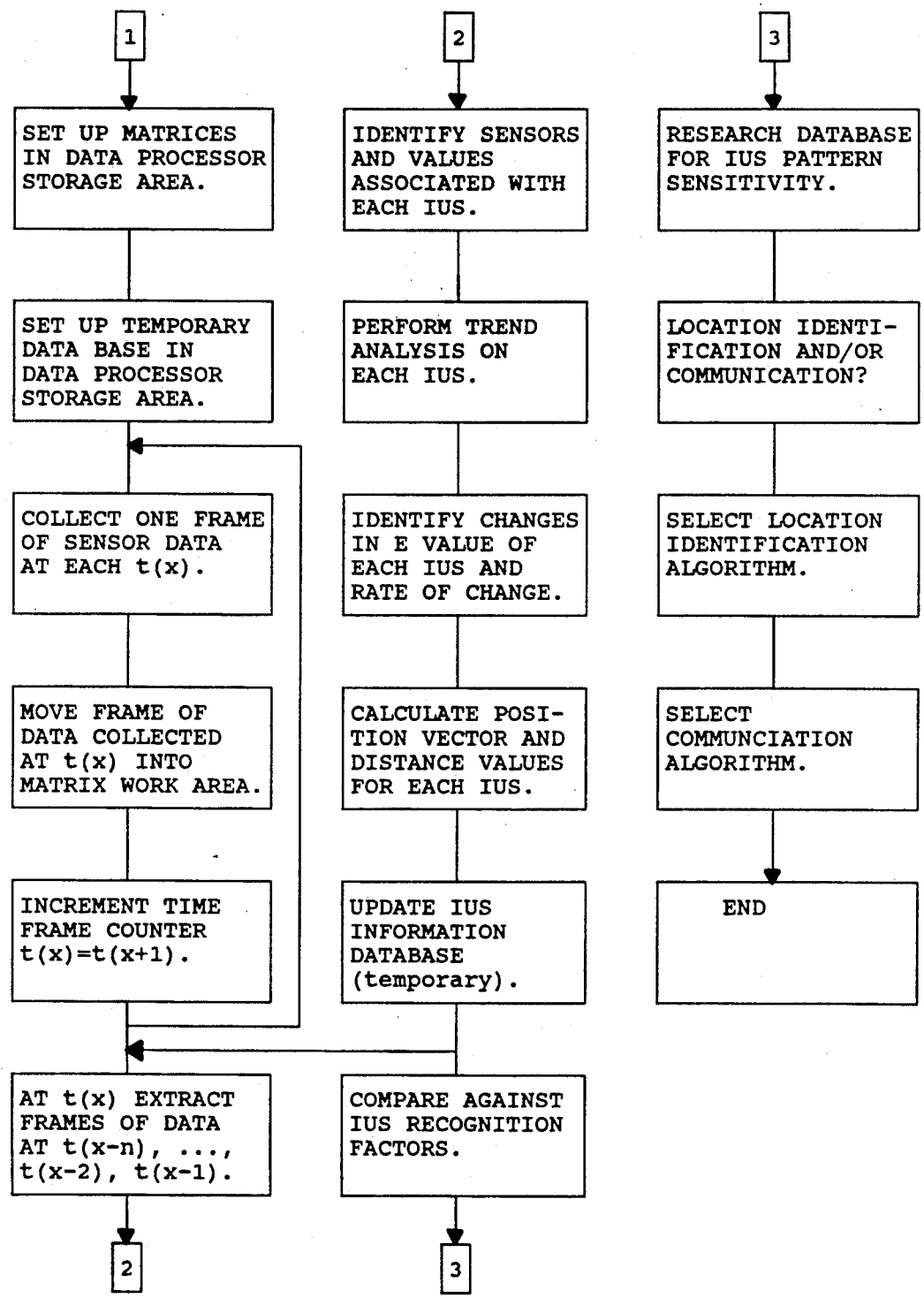
FIG. 2 is a flow diagram representing operation of the invention.
Figure 3:
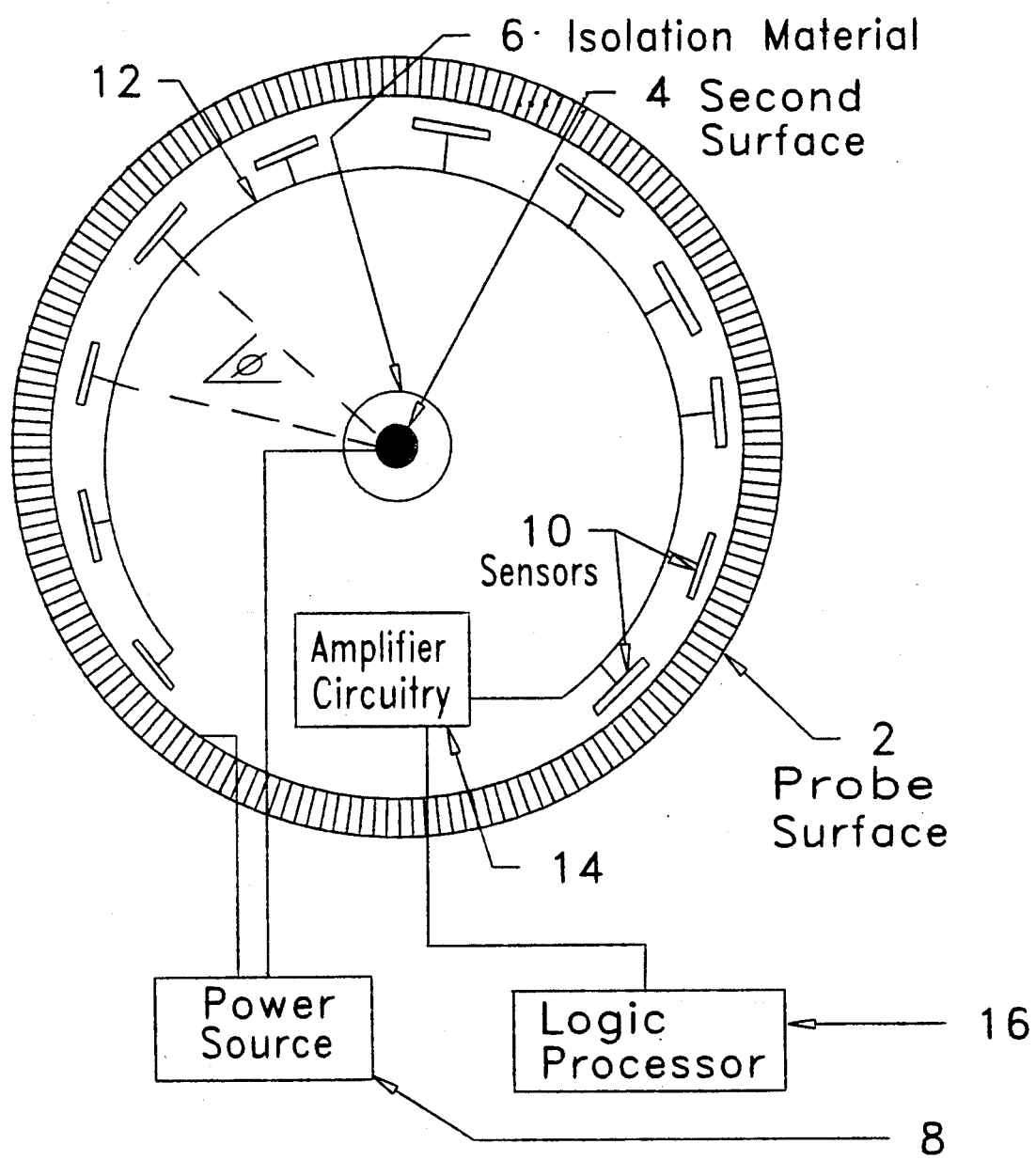
FIG. 3 is an overall view of a second embodiment of the invention.

The invention is illustrated by example thereof, in accompanying drawings wherein:

FIG. 1 is a cross sectional view of an embodiment of a spherical representation of the IEFS where the electrostatic field is placed. The voltage that provides the electrostatic field is provided by a power source means. The ongoing monitoring and tracking of the E field parameters is supported by a data collection, storing, monitoring and calculation means. This embodiment requires the return for the power source to be located outside of the surface where the induced charge is placed. Also, this embodiment places the electrostatic field sensors outside of the surface, where they measure the rear lobe of the E field density that surrounds the surface of the IEFS. The frontal lobe of the IEFS induced E field is allowed to freely expand and contract, solely based on the induced E field responses from all IUS located within the field of view of the frontal lobe of the IEFS electric field;

FIG. 2 is a top level flow chart of the preferred embodiment of a software program that collects data and determines changes in the E field sensor readings at specific points in time. The software program also performs additional calculations on the data provided by the E field signals that determines IUS position and identification information;

FIG. 3 is a cross sectional view of an alternate configuration of an embodiment of the IEFS. In this embodiment, the return for the power source and the location of the E field density sensors is inside the surface where the E field of the IEFS resides. The sensing of the changes in the IEFS E field, based on external influence of the induced E fields from an IUS, must include additional E field parameters that take into account the capacitive influence created by this configuration. This embodiment allows the IEFS to have an unrestricted field of view in the three dimensional area surrounding the invention.

LIST OF REFERENCE NUMERALS

2—Spherical Surface where the initial charge potential is placed.
4—The second surface where the opposite potential of the first charge is placed.
6—Electrical isolation material placed between the first and second surface.
8—Power source that generates the potentials for the first and second surfaces.
10—Electric Field density sensor probes.
12—Wiring harness connecting Electric Field sensor probes (10) and Electric Field amplification circuitry (14).
14—Electric Field amplification circuitry.
16—logic processor used for collection, storing, monitoring, maintaining and calculation of E field data.
18—Electric Field shield that minimizes the induced field impact of objects that are not located within the desired field of view of the IEFS.

On FIG. 1, the "Field of View" of the IEFS encompasses a 360 degree, three dimensional spherical area excluding the area where the electric field density sensor probes are located. The field of view represented by the embodiment depicted in FIG. 3, is a full 360 degree, three dimensional spherical field of view.

DESCRIPTION OF THE PREFERRED EMBODIMENTS

The IEFS uses a concept of generating an E field of energy that is spread uniformly on a surface (2). The preferred embodiment of this surface is a sphere because it simplifies the measurement calculations, however any shape can be used. The E field generation is performed by a power source (8), that puts one potential on the surface (2), and the opposite potential onto a second surface (4). The method by which the potential is placed on the first surface (2), can be either be through a conductive contact or by radiated coupling. The second surface (4) is isolated from ground and from the first surface (2), by electrical isolation material (6), that surrounds the second surface (4), and the distance between the two surfaces. The second surface (4) can be positioned anywhere inside or outside of the first surface (2) as long as its position does not significantly interfere with E field readings or calculations of the E field potential surrounding the first surface (2). The primary function of the second surface (4) is to provide a reference point to determine a relative magnitude of voltage being produced by the power source (8), and the relative magnitude of the electric field being monitored by each sensor probe (10).

The preferred embodiment of measuring the E field concentrations on the first surface (2) is through E field sensor density probe(s) (10). One E field sensor is sufficient to support the IEFS concept. However, using a multiple sensor implementation allows the IEFS to be much more responsive over a given period of time. In addition, any type of sensor can be used to measure the E field potential, either radiated or direct contact, around the first surface (2), as long as the reading that the sensor(s) provides directly correlates with the energy levels of the E field density at the point of measurement.

E field sensor probe(s) (10), mounted either outside of the surface (2), reference FIG. 1, or inside of the surface (2), reference FIG. 3, perform monitoring of the local E field density around the sphere with respect to their sensing position. These E field sensor probes provide a means of accurately determining E field density around the primary surface (2), at any point in time, by passing the localized E field density readings, at their respective locations, to the signal amplification circuitry (14). The preferred embodiment of the E field sensor probe (10) positions, is that they are located at preselected positions of equal distance between each E field sensor probe (10). However, any positioning location of the E field sensor probes (10) can be used. In the preferred embodiment of the IEFS, the distance between E field sensor probes (10) is represented by the angle phi, which allows each E field sensor probe (10) to be placed at an equal distance from each other.

The E field signal received by each E field sensor probe (10) is transmitted to the signal amplification circuitry (14), along with the location identifier of the respective E field sensor probe (10), through the wiring harness (12). The E field density sensor probe signals, along with their associated location information is processed through signal amplification circuitry (14) that increases sensitivity of E field measurements made at each E field density sensor probe position (10). In the embodiment, reference FIG. 1, the E field sensor density probes (10) are located to observe the rear lobe of the IEFS E field density. As changes in IEFS E field values occur in the frontal lobe of the E field of the IEFS, which is located within the range of the IEFS field of view, a corresponding change will occur in the rear lobe of the IEFS E field density. This placement of the E field density sensor probes (10) allows the IEFS to have an unobstructed view of induced E fields that come with in range of the IEFS field of view.

In the embodiment, reference FIG. 1, an Electric Field shield (18) is placed behind the E field sensor probes (10). This shield is used to inhibit any induced fields arising because of the potential of the E field located within the rear lobe of the IEFS.

In the preferred embodiments, a logic processor device (16) is depicted that is used for data collection, storage, monitoring and calculations. However any method of collecting, storing, monitoring, manipulating and calculating the raw E field data collected can be used.

OPERATION OF THE IEFS

The operation of the IEFS begins with the application of an E field potential (8) to the surface (2). The E field density sensor probes (10) provide E field energy density and position information of the E field that surrounds the IEFS. The E field energy density information is forwarded through the harness (12) to the E field amplification circuitry (14). The enhanced signals and position information are then presented to the logic processor (16). The logic processor (16) records the readings from the E field sensor probes at one point in time and stores the data into one "frame" that contains the readings from all of the E field sensor probes that were read during a selected period of time. Each frame of data also contains information on the amount of E field potential (8) that was applied during the time that the "frame" of E field data was collected.

As additional IUS come within range of the E field on the surface (2) of the IEFS, an opposing charge, that is of a magnitude that is related the IUS, is induced by the IEFS. The E field that surrounds the surface (2) of the IEFS will reposition itself, on this same surface (2), in a manner that concentrates a percentage of its total E field value at a location that is closest to the IUS.

The magnitude of the concentrated E field, that is responding to IUS on the surface (2) of the IEFS, will primarily be driven by three functions. The first function will be the magnitude of the induced charge being presented by the IUS. The second function will be the electrical characteristics of the medium between the IUS and the IEFS. The third function will be the distance between the IUS and the IEFS.

The movement and concentration of the E field around the surface (2) is tracked by collecting subsequent data frames of all the IEFS E field density sensor probes (10). Mathematical calculations are performed on the E field density data contained within the data frames in a manner that provides information on the IUS. These calculations provide information as to the location of the IUS with respect to the IEFS. The calculations also provide rate of change information between the IUS and the IEFS, as their respective locations and the IEFS E field magnitude/location change over time. Based on the definition of the characteristics of the medium located between the IUS and the IEFS, the calculations also provide E field characteristics peculiar to the IUS. The characteristics of the item(s) under study are compared against a known set of E field recognition parameters for subsequent reporting of additional information related to the IUS.

CONCLUSION, RAMIFICATIONS, AND SCOPE OF INVENTION

Thus there has been disclosed, in two preferred embodiments, a radiated E field sensing system, that detects E fields of IUS, and their corresponding locations, at much greater distances than heretofore addressed by the patent literature.

While my above description contains many specificities, these should not be construed as limitations on the scope of the invention, but rather as an exemplification of one preferred embodiment thereof. These examples include, but are not limited to:

- the E field sensor probes (10) could be placed outside of the IEFS surface (2), where E field changes can be detected when an E field density sensor probe (10) is placed between an IUS and the IEFS, the probe facing either towards the IUS or towards the IEFS;
- my preferred embodiment of the shape of the IEFS surface is a sphere, however, any shape will suffice as long as its shape characteristics are included in the calculations of the resultant E field density readings;
- my preferred embodiment shows E field sensor probes that sense the E field density at multiple points around the sphere, however, having only one E field density sensor probe that senses the E field at one location, will also provide sufficient information to detect any IUS that comes within the field of view of the IEFS.
- my preferred embodiment shows that the method of sensing the IEFS E field is by using E field sensors to sense E field density. However, any method of sensing, calculating or deriving the shape and/or position of the IEFS E field around the IEFS surface can be used, either radiated or conducted, where the method does not detract from accurately measuring the E field response of the IUS.
- my preferred embodiment does not show two or more IEFS units sensing each other. However, any method of sensing or otherwise communicating between IEFS units through altering or modulating the E field characteristics between the units, can be used.

Accordingly, the scope of the invention should be determined not by the embodiment(s) illustrated, but by the appended claims and their legal equivalents.

What is claimed as new is:

1. An apparatus for determining the three coordinate position of an item under study, or a plurality of items under study, located at a distance from said apparatus, and with respect to the location of said apparatus, by actively generating an electric field to surround said apparatus of sufficient magnitude to induce an electric field response from said item or items under study, said electric field response creating a redistribution of said electric field magnitude surrounding said apparatus being proportional to the interaction between said electric field response of said item or items under study and said electric field magnitude of said apparatus, comprising:

a) a probe having a surface upon which a plurality of ions are distributed over said surface creating said electric field magnitude of said apparatus, said electric field magnitude surrounding said probe providing a means to induce said electric field response from said item or items under study;

b) a second surface that is electrically isolated from said surface of said probe to provide a voltage reference means for determining the magnitude of said electric field surrounding said surface of said probe;

c) a power source means that provides said plurality of ions on said surface of said probe;

d) a sensing device means that measures the electric field magnitude at a specific point, or at a plurality of specific points, near said surface of said probe with respect to the voltage on said second surface;

amplifier circuitry, having an input connected to said sensing device and an output representative of said electric field located at each said specific point of said sensing device;

f) logic process means, having an input connected to said amplifier circuitry, that calculates the change over time of said electric field magnitude at each said specific point of said sensing device, and as said electric field magnitude of said apparatus is redistributed in response to said electric field response of said items under study, said logic process means further providing an output indicating said three coordinate position of said items under study with respect to the location of said apparatus.

2. The apparatus of claim 1, wherein said power source means develops a sufficient quantity of ions, that when the said ions are placed on said surface of said probe provide an electric field inducement means for said electric field response from said items under study.

3. The apparatus of claim 1, wherein electric field sensors contained within said sensing device, and located at specific points around said surface of said probe, provide a measurement means of said magnitude of said electric field within the area of focus of each said sensor, at each said specific point, on or near said surface of said probe, which is provided as an output to be used as inputs to said amplifier circuitry and said logic process means being used in a calculating means to determine the magnitude of the electric field surrounding said surface of said probe.

4. The apparatus of claim 1, wherein the said electric field response developed by said item under study, is of an electric field strength magnitude that is a function of the electric field strength of said magnitude of said electric field placed on said surface of said probe of said apparatus, the distance between said item under study and said apparatus, the electrical characteristics of the medium between said item under study and said surface, and the electrical characteristics of said item under study.

5. The apparatus of claim 1, wherein said measurement of said redistribution of said magnitude of said electric field surrounding said surface, that results from said electric field response of said item or items under study, provides inputs to said logic process means for deriving the said three coordinate position of said item or items under study with respect to the position of said probe.

6. The apparatus of claim 1, wherein said induced electric field response of said items under study to said magnitude of said electric field of said apparatus, provides inputs to said logic process means to derive specific characteristics related to said items under study.

7. The apparatus of claim 1, wherein measured changes between said induced electric field response of said items under study and said magnitude of said electric field of said apparatus over time, provides inputs to said logic process means to derive specific characteristics related to said items under study.

8. The apparatus of claim 1, wherein a measured change in the said magnitude of said electric field of said surface of said apparatus at said specific points around said surface of said apparatus, over time, is used as inputs to said logic process means to determine changes in position of said items under study with respect to said location of said apparatus.

9. The apparatus of claim 1, wherein said logic process executes a plurality of formulas, such that the same or similar said three coordinate position identification results of said items under study, with respect to said location of said apparatus, can be produced using said input measurements provided by said sensing device means.

10. An electric field meter apparatus for determining the location of an electric field or electric fields, both conditions hereinafter identified as "electric fields", external to the electric field of said apparatus, by inducing an electric field response of said external electric fields to said electric field of said apparatus, comprising:

a power source means that provides a plurality of ions on a surface of said apparatus;

b) a sensing device means that measures the electric field magnitude of said apparatus, at a specific point, or at a plurality of specific points, near said surface of said apparatus, with respect to a reference voltage located on a second surface of said apparatus;

c) calculation means having an input from said sensing device means that performs mathematical manipulations for determining said position of said external electric fields.

11. The apparatus of claim 10, wherein the position of said electric field magnitudes at said specific points on said apparatus, and any changes in said electric field magnitudes of said apparatus, is used as an input to said calculation means to determine said location of said external electric fields.

12. The apparatus of claim 10, wherein changes in said electric field magnitudes of said apparatus are used as an input to said calculation means to derive specific characteristics of said electric fields.

* * * * *